United States Patent
Kim et al.

(10) Patent No.: US 10,431,627 B2
(45) Date of Patent: Oct. 1, 2019

(54) MAGNETIC MEMORY DEVICES AND METHODS FOR MANUFACTURING THE SAME

(71) Applicant: SAMSUNG ELECTRONICS CO., LTD., Suwon-si (KR)

(72) Inventors: Jae Hoon Kim, Seoul (KR); Juhyun Kim, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 15/471,241

(22) Filed: Mar. 28, 2017

(65) Prior Publication Data

US 2018/0040667 A1 Feb. 8, 2018

(30) Foreign Application Priority Data

Aug. 4, 2016 (KR) .................. 10-2016-0099531

(51) Int. Cl.
| | |
|---|---|
| H01L 29/82 | (2006.01) |
| H01L 27/22 | (2006.01) |
| G11C 11/16 | (2006.01) |
| H01L 43/02 | (2006.01) |
| H01L 43/08 | (2006.01) |
| H01L 43/10 | (2006.01) |
| H01L 43/12 | (2006.01) |

(52) U.S. Cl.
CPC .......... H01L 27/222 (2013.01); G11C 11/161 (2013.01); H01L 43/02 (2013.01); H01L 43/08 (2013.01); H01L 43/10 (2013.01); H01L 43/12 (2013.01)

(58) Field of Classification Search
CPC ....... H01L 27/222; H01L 43/12; H01L 43/02; H01L 43/08; H01L 43/10; G11C 11/161
See application file for complete search history.

(56) References Cited

U.S. PATENT DOCUMENTS

| | | | |
|---|---|---|---|
| 6,052,263 | A | 4/2000 | Gill |
| 6,127,045 | A | 10/2000 | Gill |
| 7,572,645 | B2 | 8/2009 | Sun et al. |
| 7,808,027 | B2 | 10/2010 | Horng et al. |
| 8,072,800 | B2 | 12/2011 | Chen et al. |
| 8,536,669 | B2 | 9/2013 | Zhu et al. |
| 8,698,259 | B2 | 4/2014 | Krounbi et al. |
| 8,852,760 | B2 | 10/2014 | Wang et al. |
| 2007/0070553 | A1* | 3/2007 | Tsunekawa ............ B82Y 25/00 360/313 |
| 2012/0104522 | A1 | 5/2012 | Jung et al. |

(Continued)

*Primary Examiner* — Stephen M Bradley
*Assistant Examiner* — Wasiul Haider
(74) *Attorney, Agent, or Firm* — Sughrue Mion, PLLC

(57) ABSTRACT

A magnetic memory device is provided including a magnetic tunnel junction pattern having a free pattern, a reference pattern, and a tunnel barrier pattern between the free pattern and the reference pattern. The free pattern includes a first sub-free pattern, a second sub-free pattern, and a third sub-free pattern. The first sub-free pattern is between the tunnel barrier pattern and the third sub-free pattern, and the second sub-free pattern is between the first sub-free pattern and the third sub-free pattern. The second sub-free pattern includes nickel-cobalt-iron-boron (NiCoFeB), and the third sub-free pattern includes nickel-iron-boron (NiFeB). Related methods of fabrication are also provided.

12 Claims, 13 Drawing Sheets

(56) References Cited

U.S. PATENT DOCUMENTS

| | | | |
|---|---|---|---|
| 2014/0145792 A1* | 5/2014 | Wang | H01F 10/3272 |
| | | | 331/94.1 |
| 2014/0353783 A1 | 12/2014 | Oh et al. | |
| 2015/0325783 A1 | 11/2015 | Wang et al. | |
| 2017/0025602 A1* | 1/2017 | Liu | G11C 11/161 |
| 2017/0084829 A1* | 3/2017 | Lee | H01L 43/12 |

* cited by examiner

MAGNETIC MEMORY DEVICES AND METHODS FOR MANUFACTURING THE SAME

CROSS-REFERENCE TO RELATED APPLICATION

This U.S. non-provisional patent application claims priority under 35 U.S.C. § 119 to Korean Patent Application No. 10-2016-0099531, filed on Aug. 4, 2016, in the Korean Intellectual Property Office, the disclosure of which is hereby incorporated herein by reference as if set forth in its entirety.

FIELD

Embodiments of the inventive concept relate generally to semiconductor devices and, more particularly, to magnetic memory devices including a magnetic tunnel junction pattern and methods of manufacturing the same.

BACKGROUND

High-speed, low-voltage memory devices are used to provide high-speed and low-power electronic devices including memory devices. One example of such a device is a magnetic memory device. The magnetic memory device has been spotlighted as a next-generation memory device because of its high-speed operation characteristic and/or non-volatile characteristic.

The magnetic memory device is a memory device using a magnetic tunnel junction (MTJ). The magnetic tunnel junction may include two magnetic layers and an insulating layer disposed between the two magnetic layers, and a resistance of the magnetic tunnel junction may be changed according to magnetization directions of the two magnetic layers. The magnetic tunnel junction may have a high resistance when the magnetization directions of the two magnetic layers are anti-parallel to each other. On the contrary, the magnetic tunnel junction may have a low resistance when the magnetization directions of the two magnetic layers are parallel to each other. The magnetic memory device may write/sense data by using a difference between the resistances of the magnetic tunnel junction.

SUMMARY

Some embodiments of the inventive concept provide a magnetic memory device capable of reducing a switching current while maintaining thermal stability.

Further embodiments of the inventive concept also provide methods for manufacturing a magnetic memory device capable of reducing a switching current while maintaining thermal stability.

In still further embodiments a magnetic memory device includes a magnetic tunnel junction pattern including a free pattern, a reference pattern, and a tunnel barrier pattern between the free pattern and the reference pattern. The free pattern includes a first sub-free pattern, a second sub-free pattern, and a third sub-free pattern. The first sub-free pattern is disposed between the tunnel barrier pattern and the third sub-free pattern, and the second sub-free pattern is disposed between the first sub-free pattern and the third sub-free pattern. The second sub-free pattern includes nickel-cobalt-iron-boron (NiCoFeB), and the third sub-free pattern includes nickel-iron-boron (NiFeB).

In some embodiments a magnetic memory device includes a magnetic tunnel junction pattern including a free pattern, a reference pattern, and a tunnel barrier pattern between the free pattern and the reference pattern. The free pattern includes a first sub-free pattern and a second sub-free pattern. The first sub-free pattern is disposed between the tunnel barrier pattern and the second sub-free pattern. The first sub-free pattern includes cobalt-iron-boron (CoFeB), and the second sub-free pattern includes nickel-cobalt-iron-boron (NiCoFeB). A nickel content of the second sub-free pattern ranges from 10 atomic percent to 40 atomic percent.

In further embodiments a method for manufacturing a magnetic memory device includes forming a free layer, a reference layer, and a tunnel barrier layer between the free layer and the reference layer on a substrate. Forming the free layer includes forming a first sub-free layer, a second sub-free layer, and a third sub-free layer. The first sub-free layer is formed between the tunnel barrier layer and the third sub-free layer, and the second sub-free layer is formed between the first sub-free layer and the third sub-free layer. The second sub-free layer includes nickel-cobalt-iron-boron (NiCoFeB), and the third sub-free layer includes nickel-iron-boron (NiFeB).

In still further embodiments a free layer of a magnetic tunnel junction pattern is provided. The free layer includes a first sub-free pattern, a second sub-free pattern; and a third sub-free pattern. The first sub-free pattern is between a tunnel barrier pattern of the magnetic tunnel junction pattern and the third sub-free pattern. The second sub-free pattern is between the first sub-free pattern and the third sub-free pattern and includes nickel-cobalt-iron-boron (NiCoFeB). The third sub-free pattern includes nickel-iron-boron (NiFeB).

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
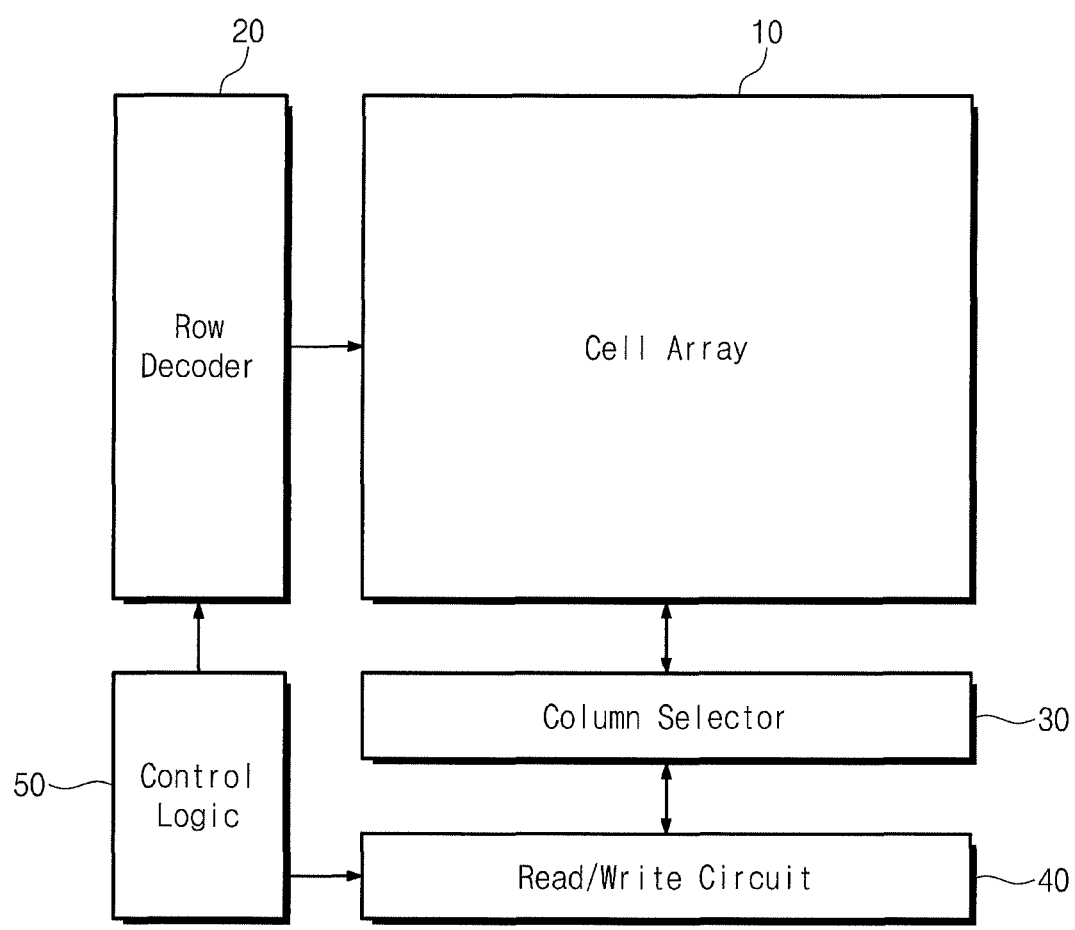
FIG. 1 is a schematic block diagram illustrating a magnetic memory device according to some embodiments of the inventive concept.

Hereinafter, the inventive concept will be described in detail by explaining example embodiments of the invention with reference to the attached drawings. Like reference numerals in the drawings denote like elements and, thus, detailed descriptions thereof will be omitted in the interest of brevity.

The inventive concept may be embodied in many different forms and should not be construed as limited to the example embodiments set forth herein. Rather, these embodiments are provided so that this disclosure will be thorough and complete, and will fully convey the scope of the inventive concept to those skilled in the art. In the drawings, lengths and sizes of layers and regions may be exaggerated for clarity.

Furthermore, though terms like 'first' and 'second' are used to describe various elements, components, regions, layers, and/or portions in various embodiments of the inventive concept, the elements, components, regions, layers, and/or portions should not be limited by these terms. These terms are only used to distinguish one element, component, region, layer, or portion from another. Thus, a first element, component, region, layer or section discussed below could be termed a second element, component, region, layer or section without departing from the teachings of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment can be embodied in a different manner, a specified process order may be performed in a different manner. For example, two processes to be described sequentially may be substantially performed at the same time or may be performed in an order opposite to the order to be described.

As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. As used herein, the term "and/or" includes any and all combinations of one or more of the associated listed items. Expressions such as "at least one of," when preceding a list of elements, modify the entire list of elements and do not modify the individual elements of the list. A terminology such as "substrate" may denote a substrate itself, or a stack structure including a substrate and predetermined layers or films formed on a surface of the substrate. Furthermore, a terminology "surface of substrate" may denote an exposed surface of the substrate itself, or an external surface of a predetermined layer or a film formed on the substrate.

Referring first to FIG. 1, a schematic block diagram illustrating a magnetic memory device according to some embodiments of the inventive concept will be discussed. As illustrated in FIG. 1, a magnetic memory device may include a memory cell array 10, a row decoder 20, a column selector 30, a read/write circuit 40, and a control logic 50.

The memory cell array 10 may include a plurality of word lines and a plurality of bit lines, and memory cells may be connected to crossing points of the word lines and the bit lines. Components of the memory cell array 10 will be discussed with reference to FIG. 2.

The row decoder 20 may be connected to the memory cell array 10 through the word lines. The row decoder 20 may decode an address signal inputted from an external system to select one among the word lines.

The column selector 30 may be connected to the memory cell array 10 through the bit lines and may decode an address signal inputted from the external system to select one among the bit lines. The selected bit line may be connected to the read/write circuit 40 through the column selector 30.

The read/write circuit 40 may provide a bit line bias for accessing a selected memory cell, in response to a control signal of the control logic 50. The read/write circuit 40 may provide a bit line voltage to the selected bit line to write data into or read data from the memory cell.

The control logic 50 may output control signals controlling the magnetic memory device, in response to command signals provided from the external system. The control signals outputted from the control logic 50 may control the read/write circuit 40.

Figure 2:
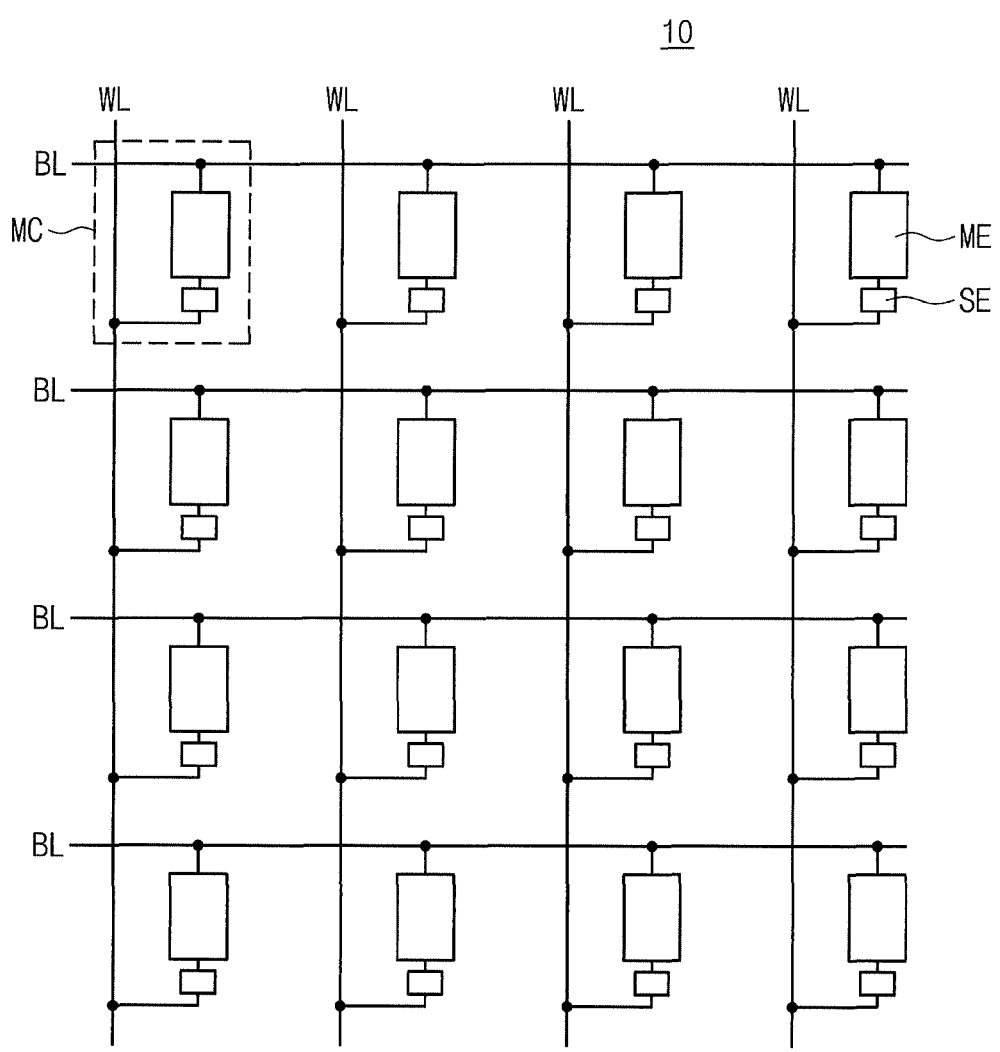
FIG. 2 is a circuit diagram illustrating a memory cell array of a magnetic memory device according to some embodiments of the inventive concept.
Figure 3:
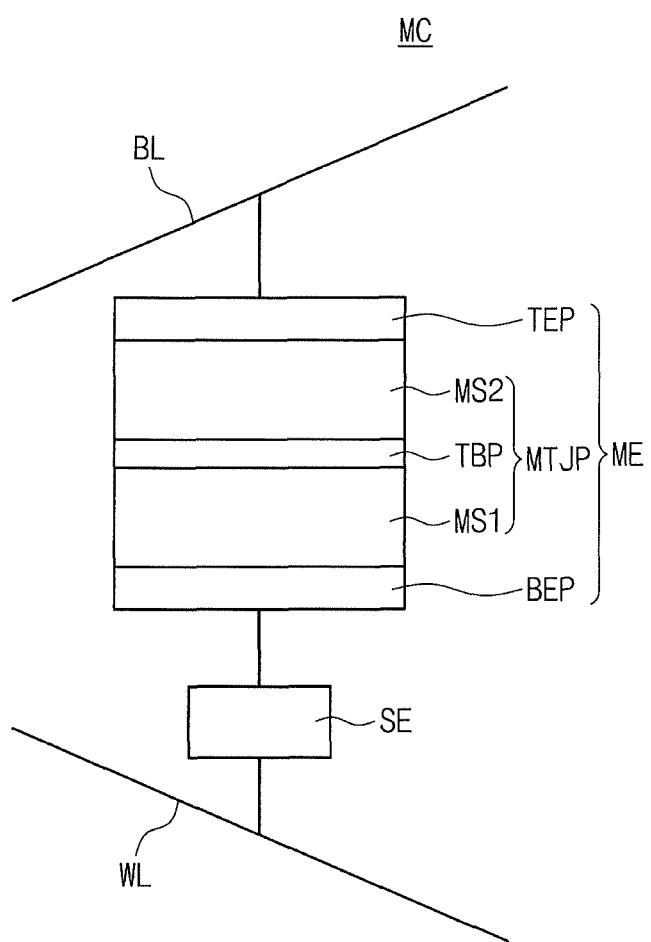
FIG. 3 is a circuit diagram illustrating a unit memory cell of a magnetic memory device according to some embodiments of the inventive concept.

FIG. 2 is a circuit diagram illustrating a memory cell array of a magnetic memory device according to some embodiments of the inventive concept. FIG. 3 is a circuit diagram illustrating a unit memory cell of a magnetic memory device according to some embodiments of the inventive concept.

Referring now to FIG. 2, a memory cell array 10 may include a plurality of first conductive lines, a plurality of second conductive lines, and a plurality of unit memory cells MC. The first conductive lines may be word lines WL, and the second conductive lines may be bit lines BL. The unit memory cells MC may be two-dimensionally or three-dimensionally arranged. The word lines WL may extend in a first direction, and the bit lines BL may extend in a second direction intersecting the first direction. The unit memory cells MC may be respectively connected to crossing points of the word lines WL and the bit lines BL. Thus, each of the unit memory cells MC connected to the word lines WL may be connected to the read/write circuit 40, discussed with reference to FIG. 1, by each of the bit lines BL.

Referring now to FIG. 3, each of the unit memory cells MC may include a memory element ME and a selection element SE. The memory element ME may be connected between the bit line BL and the selection element SE, and the selection element SE may be connected between the memory element ME and the word line WL. The memory element ME may be a variable resistance element of which a resistance state is switchable between two different resistance states by an electrical pulse applied thereto.

The memory element ME may have a structure showing a magnetoresistance characteristic and may include at least one ferromagnetic material and/or at least one anti-ferromagnetic material. In some embodiments, the memory element ME may have a structure of which an electrical resistance is changeable using spin transfer torque of electrons of a program current passing therethrough.

The selection element SE may control a flow of charges passing through the memory element ME. For example, the selection element SE may be a diode, a PNP bipolar transistor, an NPN bipolar transistor, an NMOS field effect transistor, or a PMOS field effect transistor. When the selection element SE is a three-terminal element (e.g., the bipolar transistor or the MOS field effect transistor), an additional interconnection line (not shown) may be connected to the selection element SE.

In some embodiments, the memory element ME may include a first magnetic structure MS1, a second magnetic structure MS2, and a tunnel barrier pattern TBP disposed between the first and second magnetic structures MS1 and MS2. The first magnetic structure MS1, the second magnetic structure MS2, and the tunnel barrier pattern TBP may constitute a magnetic tunnel junction pattern MTJP. Each of the first and second magnetic structures MS1 and MS2 may include at least one magnetic layer formed of a magnetic material. The memory element ME may further include a bottom electrode pattern BEP and a top electrode pattern TEP. The bottom electrode pattern BEP may be disposed between the first magnetic structure MS1 and the selection element SE, and the top electrode pattern TEP may be disposed between the second magnetic structure MS2 and the bit line BL.

Figure 4A:
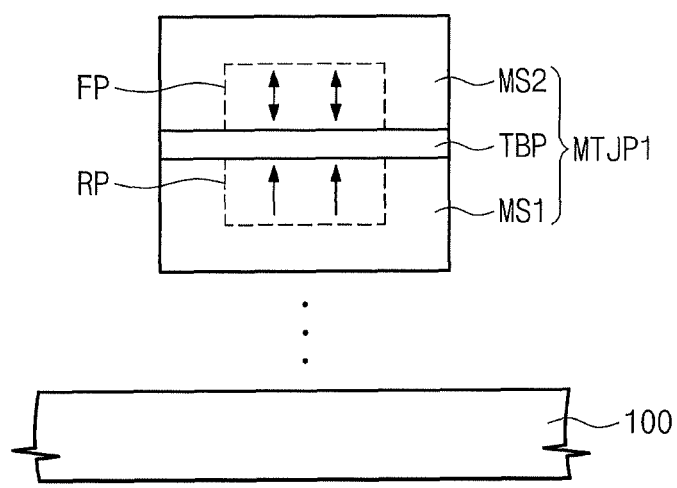
FIGS. 4A and 4B are schematic views illustrating magnetic tunnel junction patterns according to some embodiments of the inventive concept.
Figure 4B:
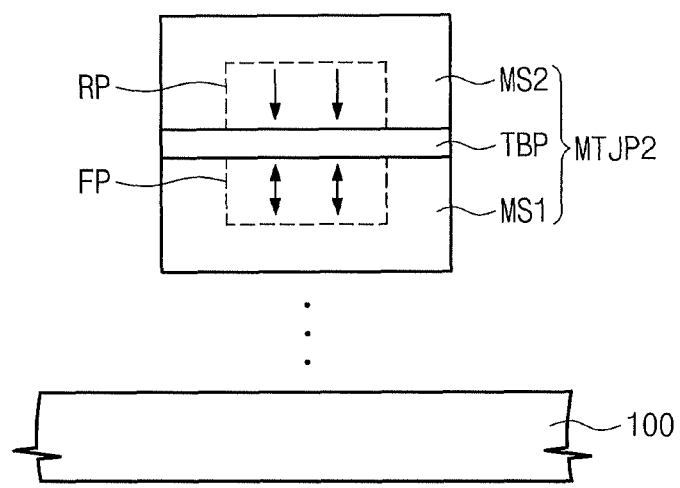

Referring now to FIGS. 4A and 4B, schematic views illustrating magnetic tunnel junction patterns according to some embodiments of the inventive concept will be discussed. As illustrated in FIGS. 4A and 4B, a magnetic tunnel junction pattern MTJP1 or MTJP2 may be provided on a substrate 100. The magnetic tunnel junction pattern MTJP1 or MTJP2 may include a first magnetic structure MS1, a tunnel barrier pattern TBP, and a second magnetic structure MS2, which are sequentially stacked on the substrate 100. The first magnetic structure MS1 may be provided between the substrate 100 and the tunnel barrier pattern TBP, and the second magnetic structure MS2 may be spaced apart from the first magnetic structure MS1 with the tunnel barrier pattern TBP interposed therebetween.

Under normal usage environment, a magnetization direction of one of a magnetic pattern included in the first magnetic structure MS1 and a magnetic pattern included in the second magnetic structure MS2 may be fixed regardless of a program current passing therethrough (or a program magnetic field applied thereto). Hereinafter, the magnetic pattern having the fixed magnetization direction is defined as a reference pattern RP. A magnetization direction of the other of the magnetic pattern included in the first magnetic structure MS1 and the magnetic pattern included in the second magnetic structure MS2 may be switchable by the program current passing therethrough (or the program magnetic field applied thereto). Hereinafter, the magnetic pattern having the switchable (or variable) magnetization direction is defined as a free pattern FP. The magnetic tunnel junction pattern MTJP1 or MTJP2 may include at least one free pattern FP and at least one reference pattern RP separated from the at least one free pattern with the tunnel barrier pattern TBP therebetween.

An electrical resistance of the magnetic tunnel junction pattern MTJP1 or MTJP2 may be dependent on the magnetization directions of the free pattern FP and the reference pattern RP. The magnetic tunnel junction pattern MTJP1 or MTJP2 may have a first electrical resistance value when the magnetization directions of the free and reference patterns FP and RP are parallel to each other. The magnetic tunnel junction pattern MTJP1 or MTJP2 may have a second electrical resistance value when the magnetization directions of the free and reference patterns FP and RP are anti-parallel to each other. In these embodiments, the second electrical resistance value may be much greater than the first electrical resistance value. As a result, the electrical resistance of the magnetic tunnel junction pattern MTJP1 or MTJP2 may be adjusted by changing the magnetization direction of the free pattern FP. This principle may be used as a principle of storing data in the magnetic memory device according to some embodiments of the inventive concept.

Each of the first and second magnetic structures MS1 and MS2 may include at least one magnetic pattern having a magnetization direction substantially perpendicular to a top surface of the substrate 100. In these embodiments, the magnetic tunnel junction pattern MTJP1 or MTJP2 may be classified as one of the two following types on the basis of relative positions of the free and reference patterns FP and RP from the substrate 100 and/or on the basis of the formation order of the free and reference patterns FP and RP.

In some embodiments, as illustrated in FIG. 4A, the magnetic tunnel junction pattern MTJP1 may be a first type magnetic tunnel junction pattern MTJP1 in which the first magnetic structure MS1 and the second magnetic structure MS2 include the reference pattern RP and the free pattern FP, respectively. In some embodiments, as illustrated in FIG. 4B, the magnetic tunnel junction pattern MTJP2 may be a second type magnetic tunnel junction pattern MTJP2 in which the first magnetic structure MS1 and the second magnetic structure MS2 include the free pattern FP and the reference pattern RP, respectively.

Figure 5A:
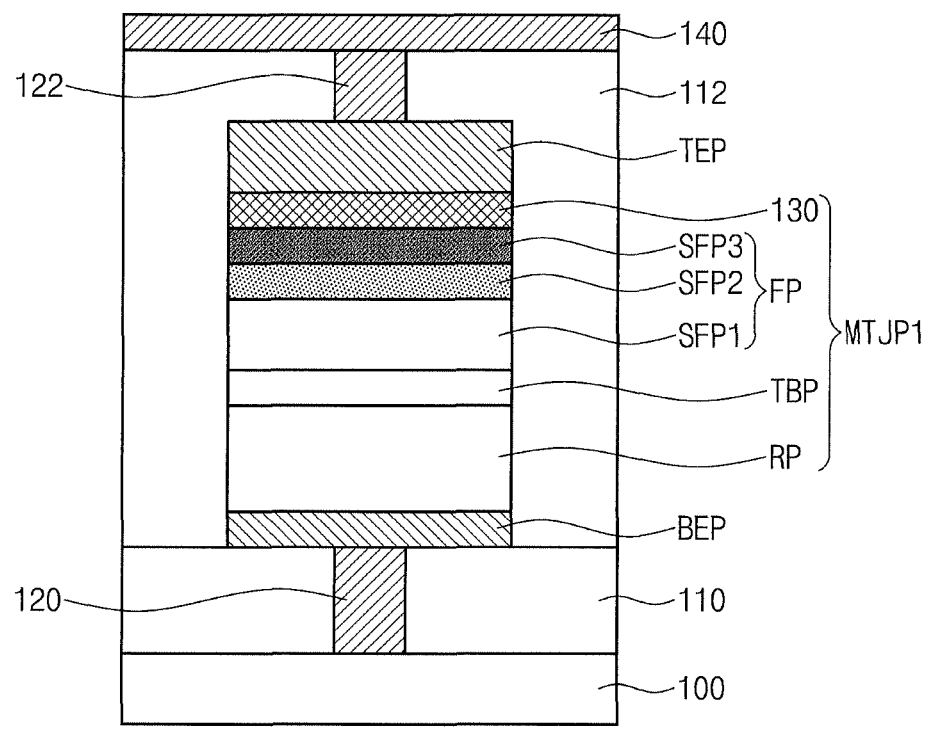
FIGS. 5A and 5B are cross-sections illustrating magnetic memory devices according to some embodiments of the inventive concept.
Figure 5B:
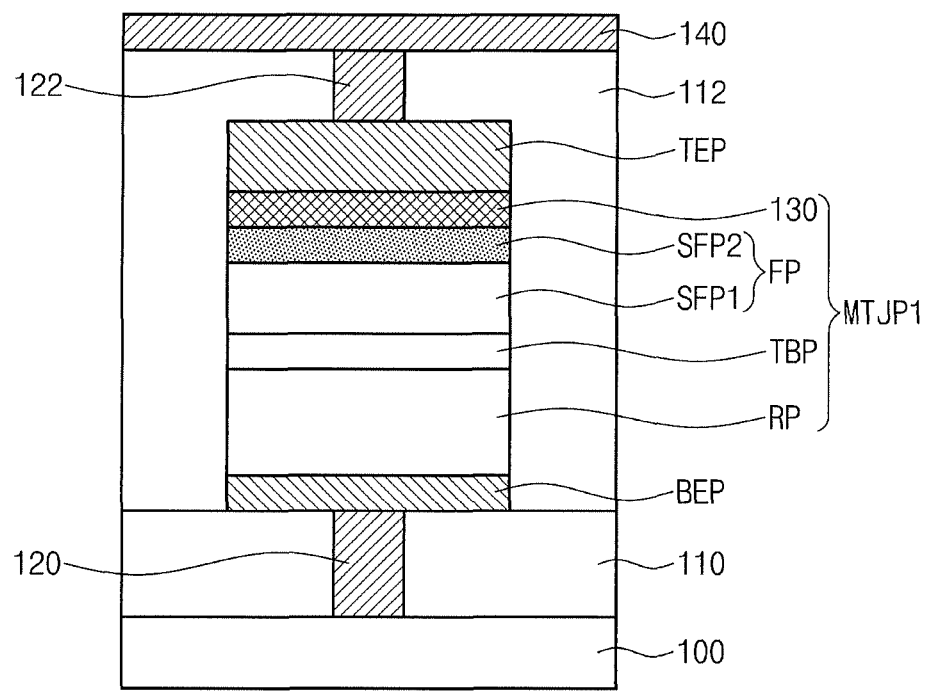

Referring now to FIGS. 5A and 5B, cross-sections illustrating magnetic memory devices according to some embodiments of the inventive concept will be discussed. In particular, FIGS. 5A and 5B are cross-sections illustrating magnetic memory devices including the first type magnetic tunnel junction patterns MTJP1 discussed with reference to FIG. 4A, respectively.

As illustrated in FIGS. 5A and 5B, a substrate 100 may be provided. For example, the substrate 100 may be, for example, a silicon substrate, a germanium substrate, or a silicon-germanium substrate. A selection element (not shown) may be provided on the substrate 100.

A first interlayer insulating layer 110 may be provided on the substrate 100. The first interlayer insulating layer 110 may cover the selection element. For example, the first interlayer insulating layer 110 may include at least one of silicon oxide, silicon nitride, and silicon oxynitride.

A lower contact plug 120 may be provided in the first interlayer insulating layer 110. The lower contact plug 120 may be electrically connected to one terminal of the selection element. The lower contact plug 120 may include a conductive material. For example, the lower contact plug 120 may include at least one of a doped semiconductor material (e.g., doped silicon), a metal (e.g., tungsten, aluminum, copper, titanium, or tantalum), a conductive metal nitride (e.g., titanium nitride, tantalum nitride, or tungsten nitride), and a metal-semiconductor compound (e.g., a metal silicide).

A bottom electrode pattern BEP, a reference pattern RP, a tunnel barrier pattern TBP, a free pattern FP, a capping pattern 130, and a top electrode pattern TEP may be sequentially provided on the first interlayer insulating layer 110. The reference pattern RP, the tunnel barrier pattern TBP, the free pattern FP, and the capping pattern 130 may constitute a magnetic tunnel junction pattern MTJP1. The bottom electrode pattern BEP, the magnetic tunnel junction pattern MTJP1, and the top electrode pattern TEP may have sidewalls aligned with each other. Even though not shown in the drawings, the sidewalls of the bottom electrode pattern BEP, the magnetic tunnel junction pattern MTJP1 and the top electrode pattern TEP may have a slope profile.

The bottom electrode pattern BEP may be electrically connected to the one terminal of the selection element through the lower contact plug 120. The bottom electrode pattern BEP may include at least one of a conductive metal nitride and a metal.

In some embodiments, the bottom electrode pattern BEP may act as a seed for forming a pattern provided directly on the bottom electrode pattern BEP. In some embodiments, when the pattern provided directly on the bottom electrode pattern BEP has a $L1_0$ crystal structure, the bottom electrode pattern BEP may include a conductive metal nitride having sodium chloride (NaCl) crystal structure, e.g., titanium nitride, tantalum nitride, chromium nitride, or vanadium nitride. In some embodiments, when the pattern provided directly on the bottom electrode pattern BEP has a hexagonal close packed (HCP) crystal structure, the bottom electrode pattern BEP may be formed of a conductive material having the HCP crystal structure, for example, ruthenium. However, the materials described above are provided as examples only to disclose technical features of the inventive concept, and embodiments of the inventive concept are not limited thereto.

The reference pattern RP may be disposed on the bottom electrode pattern BEP. The reference pattern RP may have a magnetization direction that is substantially perpendicular to a top surface of the substrate 100.

The reference pattern RP may include at least one of a material having a $L1_0$ crystal structure, a material having a HCP lattice, and an amorphous rare earth-transition metal (RE-TM) alloy. In some embodiments, the reference pattern RP may include the material having the $L1_0$ crystal structure, which includes at least one of $Fe_{50}Pt_{50}$, $Fe_{50}Pd_{50}$, $Co_{50}Pt_{50}$, $Co_{50}Pd_{50}$, and $Fe_{50}Ni_{50}$. In some embodiments, the reference pattern RP may include a cobalt-platinum (CoPt) disordered alloy with a platinum (Pt) content of 10 atomic percent to 45 atomic percent or $Co_3Pt$ ordered alloy, which has the HCP lattice. In some embodiments, the reference pattern RP may include the amorphous RE-TM alloy which includes at least one of iron (Fe), cobalt (Co), and nickel (Ni) and at least one of terbium (Tb), dysprosium (Dy), and gadolinium (Gd). Fe, Co, and Ni may correspond to the transition metals, and Tb, Dy, and Gd may correspond to the rare earth metals.

In some embodiments, the reference pattern RP may include a material having interfacial perpendicular magnetic anisotropy (i-PMA). The interface perpendicular magnetic anisotropy means a phenomenon that a magnetic layer having an intrinsic horizontal magnetization property has a perpendicular magnetization direction by an influence of an interface between the magnetic layer and another layer adjacent to the magnetic layer. In these embodiments, the intrinsic horizontal magnetization property may mean that a magnetic layer has a magnetization direction parallel to the widest surface of the magnetic layer when an external factor does not exist. For example, when the magnetic layer having the intrinsic horizontal magnetization property is formed on a substrate and an external factor does not exist, the magnetization direction of the magnetic layer may be substantially parallel to a top surface of the substrate. For example, the reference pattern RP may include at least one of cobalt (Co), iron (Fe), and nickel (Ni). The reference pattern RP may further include at least one selected from non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), and nitrogen (N). For example, the reference pattern RP may include CoFe or NiFe and may further include boron (B). Furthermore, to reduce a saturation magnetization of the reference pattern RP, the reference pattern RP may further include at least one of titanium (Ti), aluminum (Al), silicon (Si), magnesium (Mg), and tantalum (Ta).

The tunnel barrier pattern TBP may be disposed on the reference pattern RP. For example, the tunnel barrier pattern TBP may include at least one of magnesium oxide (MgO), titanium oxide (TiO), aluminum oxide (AlO), magnesium-zinc oxide (MgZnO), and magnesium-boron oxide (MgBO). In some embodiments, the tunnel barrier pattern TBP may include magnesium oxide having the sodium chloride (NaCl) crystal structure.

The free pattern FP may be disposed on the tunnel barrier pattern TBP. According to some embodiments, the free pattern FP may include a first sub-free pattern SFP1, a second sub-free pattern SFP2, and a third sub-free pattern SFP3, as illustrated in FIG. 5A.

Referring to FIG. 5A, the first sub-free pattern SFP1 may be disposed between the tunnel barrier pattern TBP and the third sub-free pattern SFP3, and the second sub-free pattern SFP2 may be disposed between the first sub-free pattern SFP1 and the third sub-free pattern SFP3. The first sub-free pattern SFP1 may have one surface being in contact with the tunnel barrier pattern TBP and another surface being in contact with the second sub-free pattern SFP2. The second sub-free pattern SFP2 may have one surface being in contact with the first sub-free pattern SFP1 and another surface being in contact with the third sub-free pattern SFP3.

A thickness of the first sub-free pattern SFP1 may be greater than those of the second and third sub-free patterns SFP2 and SFP3. In some embodiments, the thickness of the first sub-free pattern SFP1 may range from about 5 Å to about 15 Å, the thickness of the second sub-free pattern SFP2 may range from about 2 Å to about 10 Å, and the thickness of the third sub-free pattern SFP3 may range from about 2 Å to about 10 Å.

The first sub-free pattern SFP1 may include cobalt-iron-boron (CoFeB). The second sub-free pattern SFP2 may include nickel-cobalt-iron-boron (NiCoFeB). A nickel content of the second sub-free pattern SFP2 may range from about 10 atomic percent to about 40 atomic percent. The third sub-free pattern SFP3 may include nickel-iron-boron (NiFeB). A nickel content of the third sub-free pattern SFP3 may range from about 10 atomic percent to about 40 atomic percent.

A nickel content of the first sub-free pattern SFP1 may be smaller than the nickel content of the second sub-free pattern SFP2 and the nickel content of the third sub-free pattern SFP3. For example, the first sub-free pattern SFP1 may not include nickel or may include nickel atoms diffused from the second sub-free pattern SFP2 and/or the third sub-free pattern SFP3.

A cobalt content of the third sub-free pattern SFP3 may be smaller than a cobalt content of the first sub-free pattern SFP1 and a cobalt content of the second sub-free pattern SFP2. For example, the third sub-free pattern SFP3 may not include cobalt or may include cobalt atoms diffused from the first sub-free pattern SFP1 and/or the second sub-free pattern SFP2.

At an interface of the first sub-free pattern SFP1 and the tunnel barrier pattern TBP, iron atoms of the first sub-free pattern SFP1 may be combined with oxygen atoms of the tunnel barrier pattern TBP to induce interfacial perpendicular magnetic anisotropy. Similarly, at an interface of the third sub-free pattern SFP3 and the capping pattern 130, iron atoms of the third sub-free pattern SFP3 may be combined with oxygen atoms of the capping pattern 130 to induce interfacial perpendicular magnetic anisotropy. Thus, the free pattern FP may have a magnetization direction that is substantially perpendicular to the top surface of the substrate 100.

According to some embodiments, the free pattern FP may include the first sub-free pattern SFP1 and the second sub-free pattern SFP2, as illustrated in FIG. 5B. The free pattern FP according to the these embodiments may be substantially the same as the free pattern FP discussed with reference to FIG. 5A except that the third sub-free pattern SFP3 is omitted. In these embodiments, iron atoms of the second sub-free pattern SFP2 may be combined with oxygen atoms of the capping pattern 130 at an interface of the second sub-free pattern SFP2 and the capping pattern 130 to induce interfacial perpendicular magnetic anisotropy.

The capping pattern 130 may include a metal oxide. For example, the capping pattern 130 may include at least one of tantalum oxide, magnesium oxide, titanium oxide, zirconium oxide, hafnium oxide, and zinc oxide.

The capping pattern 130 may be spaced apart from the tunnel barrier pattern TBP with the free pattern FP interposed therebetween. The capping pattern 130 may be in contact with the free pattern FP. When the free pattern FP includes the third sub-free pattern SFP3 as discussed with reference to FIG. 5A, the capping pattern 130 may be in contact with the third sub-free pattern SFP3. When the free pattern FP does not include the third sub-free pattern SFP3 as discussed with reference to FIG. 5B, the capping pattern 130 may be in contact with the second sub-free pattern SFP2.

The top electrode pattern TEP may include a conductive material. For example, the top electrode pattern TEP may include at least one of a metal (e.g., tungsten, aluminum, copper, titanium, ruthenium, or tantalum) and a conductive metal nitride (e.g., titanium nitride, tantalum nitride, or tungsten nitride).

A second interlayer insulating layer 112 may be provided on a top surface of the substrate 100 to cover the bottom electrode pattern BEP, the magnetic tunnel junction pattern MTJP1, and the top electrode pattern TEP. The second interlayer insulating layer 112 may include at least one of silicon oxide, silicon nitride, and silicon oxynitride.

An upper contact plug 122 may be provided in the second interlayer insulating layer 112. The upper contact plug 122 may be electrically connected to the top electrode pattern TEP. An interconnection line 140 may be provided on the second interlayer insulating layer 112. The interconnection line 140 may be electrically connected to the upper contact plug 122. The interconnection line 140 may be a bit line.

Each of the upper contact plug 122 and the interconnection line 140 may include a conductive material. For example, each of the upper contact plug 122 and the interconnection line 140 may include at least one of a doped semiconductor material (e.g., doped silicon), a metal (e.g., tungsten, aluminum, copper, titanium, or tantalum), a conductive metal nitride (e.g., titanium nitride, tantalum nitride, or tungsten nitride), and a metal-semiconductor compound (e.g., a metal silicide).

According to some embodiments of the inventive concept, the free pattern FP may include the first sub-free pattern SFP1 including cobalt-iron-boron (CoFeB) and the second sub-free pattern SFP2 including nickel-cobalt-iron-boron (NiCoFeB). The nickel content of the second sub-free pattern SFP2 may range from about 10 atomic percent to about 40 atomic percent. Furthermore, according to some embodiments of the inventive concept, the free pattern FP may further include the third sub-free pattern SFP3 including nickel-iron-boron (NiFeB). The nickel content of the third sub-free pattern SFP3 may range from about 10 atomic percent to about 40 atomic percent. Thus, a switching current of the magnetic tunnel junction pattern can be reduced in a state where thermal stability of the magnetic tunnel junction pattern is maintained. This will be discussed with reference to FIG. 9.

Figure 6A:
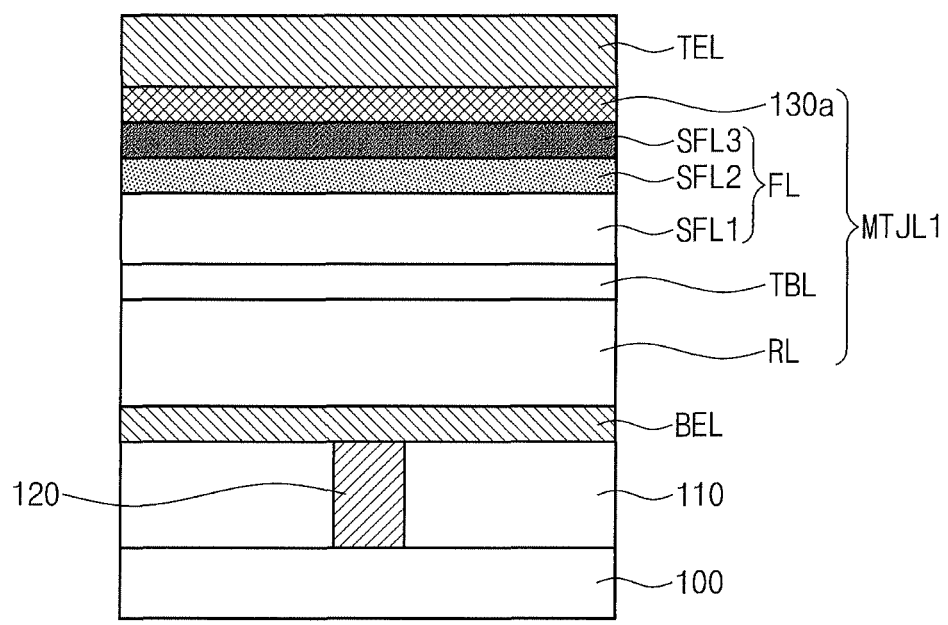
FIGS. 6A and 6B are cross-sections illustrating processing steps in the fabrication of a magnetic memory device according to some embodiments of the inventive concept.
Figure 6B:
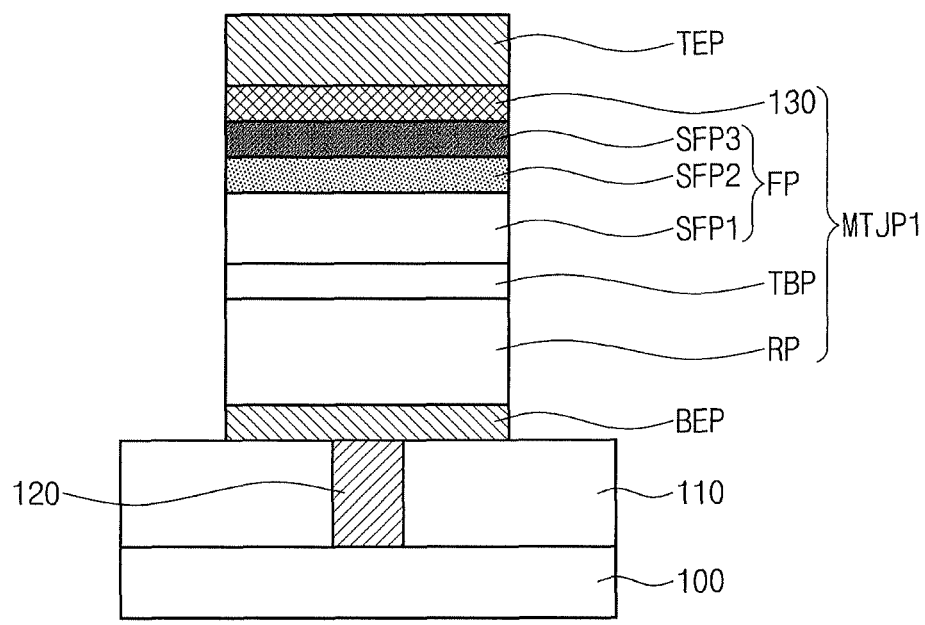

FIGS. 6A and 6B are cross-sections illustrating processing steps in the fabrication of a magnetic memory device according to some embodiments of the inventive concept. It will be understood that the same or similar components discussed above with respect to FIGS. 5A and 5B will be indicated by the same or similar reference numerals or the same or similar reference designators. Thus, descriptions to these components will be omitted or mentioned briefly for the purpose of ease and convenience in explanation.

Referring now to FIG. 6A, a first interlayer insulating layer 110 may be formed on a substrate 100. The first interlayer insulating layer 110 may be formed on the substrate 100 to cover a selection element (not shown).

A lower contact plug 120 may be formed to penetrate the first interlayer insulating layer 110. The lower contact plug 120 may be electrically connected to one terminal of the selection element.

A bottom electrode layer BEL may be formed on the first interlayer insulating layer 110. The bottom electrode layer BEL may include substantially the same material as the bottom electrode pattern BEP discussed above with respect to FIGS. 5A and 5B. The bottom electrode layer BEL may be formed using a physical vapor deposition (PVD) process, a chemical vapor deposition (CVD) process, or an atomic layer deposition (ALD) process. For example, the bottom electrode layer BEL may be formed using a sputtering deposition process corresponding to one kind of the PVD process.

A magnetic tunnel junction layer MTJL1 may be formed on the bottom electrode layer BEL. Forming the magnetic tunnel junction layer MTJL1 may include forming a reference layer RL, a free layer FL, and a tunnel barrier layer TBL between the reference and free layers RL and FL. Forming the magnetic tunnel junction layer MTJL1 may further include forming a capping layer 130a coming in contact with the free layer FL.

In particular, the reference layer RL may be formed on the bottom electrode layer BEL. The reference layer RL may include substantially the same material as the reference pattern RP discussed with reference to FIGS. 5A and 5B. The tunnel barrier layer TBL may be formed on the reference layer RL. The tunnel barrier layer TBL may include substantially the same material as the tunnel barrier pattern TBP discussed with reference to FIGS. 5A and 5B. Each of the reference layer RL and the tunnel barrier layer TBL may be formed using a PVD process, a CVD process, or an ALD process. For example, each of the reference layer RL and the tunnel barrier layer TBL may be formed using a sputtering deposition process.

The free layer FL may be formed on the tunnel barrier layer TBL. Forming the free layer FL may include forming a first sub-free layer SFL1, a second sub-free layer SFL2, and a third sub-free layer SFL3. The first sub-free layer SFL1 may be formed between the tunnel barrier layer TBL and the third sub-free layer SFL3, and the second sub-free layer SFL2 may be formed between the first sub-free layer SFL1 and the third sub-free layer SFL3. For example, the first sub-free layer SFL1 may be formed directly on the tunnel barrier layer TBL, the second sub-free layer SFL2 may be formed directly on the first sub-free layer SFL1, and the third sub-free layer SFL3 may be formed directly on the second sub-free layer SFL2. Immediately after the formation of each of the first to third sub-free layers SFL1 to SFL3, each of the first to third sub-free layers SFL1 to SFL3 may be in an amorphous state.

A thickness of the first sub-free layer SFL1 may be greater than those of the second and third sub-free layers SFL2 and SFL3. In some embodiments, the thickness of the first sub-free layer SFL1 may range from about 5 Å to about 15 Å, the thickness of the second sub-free layer SFL2 may range from about 2 Å to about 10 Å, and the thickness of the third sub-free layer SFL3 may range from about 2 Å to about 10 Å.

The first sub-free layer SFL1 may include cobalt-iron-boron (CoFeB). For example, the first sub-free layer SFL1 may be formed by a sputtering deposition process using a target including cobalt-iron-boron (CoFeB). The target for forming the first sub-free layer SFL1 may not include nickel. For example, the target for forming the first sub-free layer SFL1 may include $Co_{a1}Fe_{b1}B_{c1}$. At this time, "a1" may range from 0.2 to 0.6, "b1" may range from 0.2 to 0.6, and "c1" may range from 0.1 to 0.3. In these embodiments, a sum of a1, b1, and c1 is 1, i.e., a1+b1+c1=1.

The second sub-free layer SFL2 may include nickel-cobalt-iron-boron (NiCoFeB). For example, the second sub-free layer SFL2 may be formed by a sputtering deposition process using a target including nickel-cobalt-iron-boron (NiCoFeB). The target for forming the second sub-free layer SFL2 may include nickel of about 10 atomic percent to about 40 atomic percent. For example, the target for forming the second sub-free layer SFL2 may include $Ni_{x1}(Co_{a2}Fe_{b2}B_{c2})_{1-x1}$. At this time, "x1" may range from 0.1 to 0.4, "a2" may range from 0.2 to 0.6, "b2" may range from 0.2 to 0.6, and "c2" may range from 0.1 to 0.3. Here, a sum of a2, b2, and c2 is 1, i.e., a2+b2+c2=1. In some embodiments, c2 may be smaller than c1.

The third sub-free layer SFL3 may include nickel-iron-boron (NiFeB). For example, the third sub-free layer SFL3 may be formed by a sputtering deposition process using a target including nickel-iron-boron (NiFeB). The target for forming the third sub-free layer SFL3 may include nickel of about 10 atomic percent to about 40 atomic percent. Furthermore, the target for forming the third sub-free layer SFL3 may not include cobalt. For example, the target for forming the third sub-free layer SFL3 may include $Ni_{x2}(Fe_{b3}B_{c3})_{1-x2}$. At this time, "x2" may range from 0.1 to 0.4, "b3" may range from 0.7 to 0.9, and "c3" may range from 0.1 to 0.3. In these embodiments, a sum of b3 and c3 is 1, i.e., b3+c3=1. In some embodiments, c3 may be smaller than c2.

In some embodiments, the process of forming the third sub-free layer SFL3 may be omitted, unlike FIG. 6A. These embodiments may correspond to a process for manufacturing the magnetic memory device illustrated in FIG. 5B.

The capping layer 130a may be formed on the free layer FL. The capping layer 130a may include substantially the same material as the capping pattern 130 discussed with reference to FIGS. 5A and 5B. The capping layer 130a may be formed using a PVD process, a CVD process, or an ALD process. For example, the capping layer 130a may be formed using a sputtering deposition process.

A thermal treatment process may be performed after the formation of the capping layer 130a. By the thermal treatment process, boron (B) included in the free layer FL may be diffused into other layers adjacent thereto. For example, boron (B) included in the free layer FL may be diffused into the tunnel barrier layer TBL and/or the capping layer 130a by the thermal treatment process. Thus, at least a portion of the free layer FL may be crystallized.

Iron atoms of the first sub-free layer SFL1 may be combined with oxygen atoms of the tunnel barrier layer TBL at an interface of the first sub-free layer SFL1 and the tunnel barrier layer TBL by the thermal treatment process, and thus interfacial perpendicular magnetic anisotropy may be induced at the interface. Likewise, iron atoms of the third sub-free layer SFL3 may be combined with oxygen atoms of the capping layer 130a at an interface of the third sub-free layer SFL3 and the capping layer 130a by the thermal treatment process, and thus interfacial perpendicular magnetic anisotropy may be induced at the interface.

A top electrode layer TEL may be formed on the magnetic tunnel junction layer MTJL1. The top electrode layer TEL may include substantially the same material as the top electrode pattern TEP discussed with reference to FIGS. 5A and 5B. The top electrode layer TEL may be formed using a PVD process, a CVD process, or an ALD process. For example, the top electrode layer TEL may be formed using a sputtering deposition process.

Referring to FIG. 6B, the top electrode layer TEL, the magnetic tunnel junction layer MTJL1, and the bottom electrode layer BEL may be sequentially patterned to form a bottom electrode pattern BEP, a magnetic tunnel junction pattern MTJP1, and a top electrode pattern TEP, which are sequentially stacked. Patterning the layers TEL, MTJL1, and BEL may be performed using, for example, an ion beam etching process. The magnetic tunnel junction pattern MTJP1 may include a reference pattern RP, a tunnel barrier pattern TBP, a free pattern FP, and a capping pattern 130, which are formed by patterning the reference layer RL, the tunnel barrier layer TBL, the free layer FL, and the capping layer 130a. The free pattern FP may include first to third sub-free patterns SFP1, SFP2, and SFP3 which are formed by patterning the first to third sub-free layers SFL1, SFL2, and SFL3.

Referring again to FIG. 5A, a second interlayer insulating layer 112 may be formed to cover the bottom electrode pattern BEP, the magnetic tunnel junction pattern MTJP1, and the top electrode pattern TEP. An upper contact plug 122 may be formed to penetrate the second interlayer insulating layer 112. The upper contact plug 122 may be electrically connected to the top electrode pattern TEP. An interconnection line 140 may be formed on the second interlayer insulating layer 112 so as to be electrically connected to the upper contact plug 122.

Figure 7A:
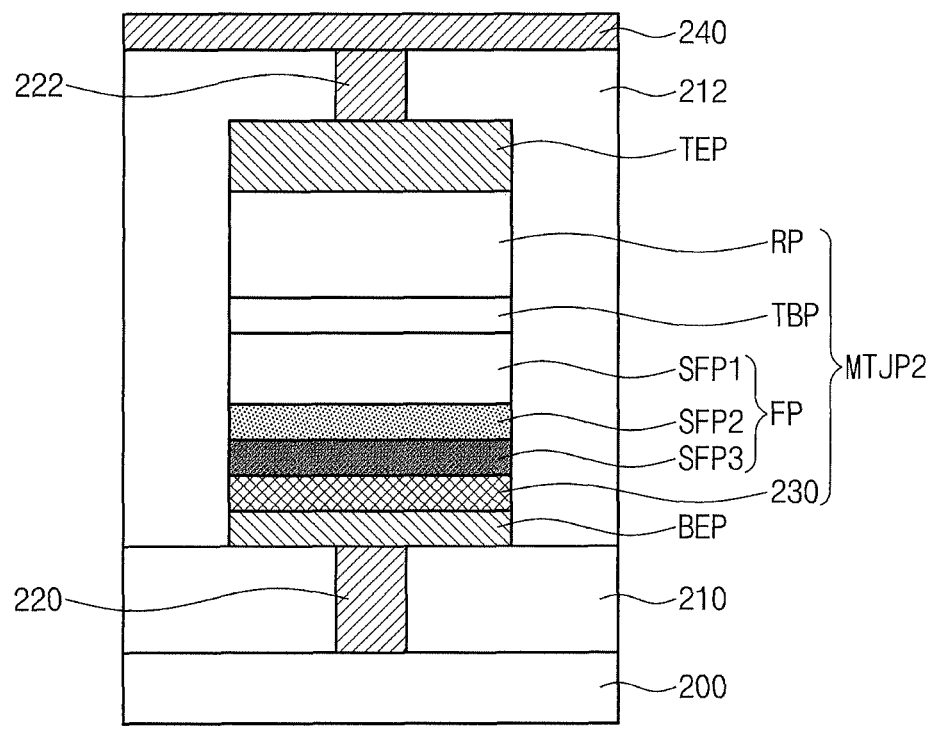
FIGS. 7A and 7B are cross-sections illustrating magnetic memory devices according to some embodiments of the inventive concept.
Figure 7B:
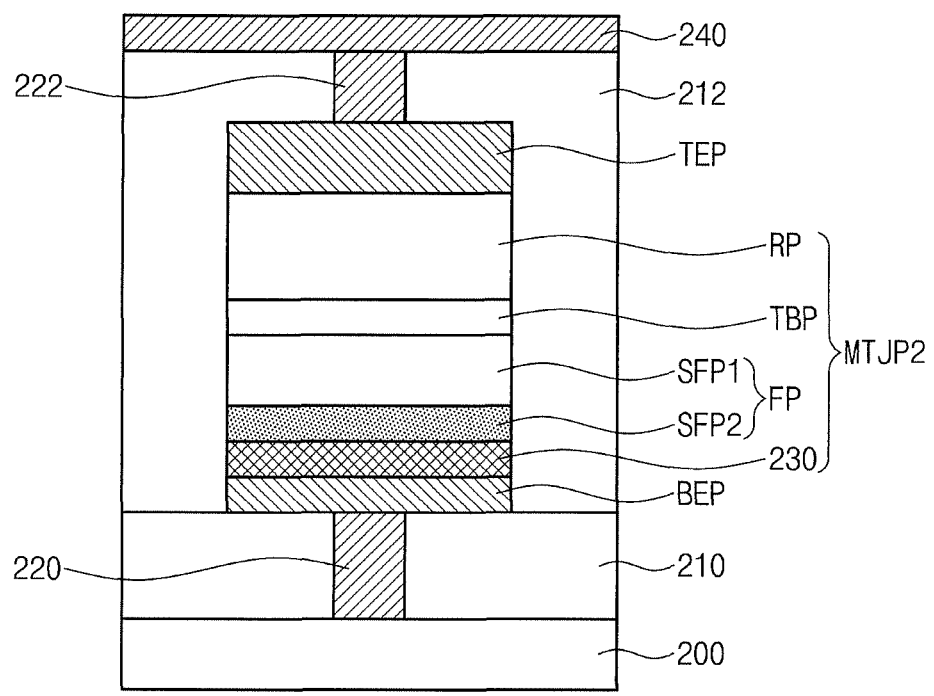

Referring now to FIGS. 7A and 7B, cross-sections illustrating magnetic memory devices according to some embodiments of the inventive concept will be discussed. In particular, FIGS. 7A and 7B are cross-sections illustrating magnetic memory devices including the second type magnetic tunnel junction patterns MTJP2 discussed above with reference to FIG. 4B. Hereinafter, the same or similar components as in the embodiments of FIGS. 5A and 5B will be indicated by the same or similar reference numerals or the same or similar reference designators. Thus, descriptions to these components will be omitted or mentioned briefly for the purpose of ease and convenience in explanation.

Referring to FIGS. 7A and 7B, a magnetic memory device according to some embodiments of the inventive concept may include a substrate 200, a first interlayer insulating layer 210, a lower contact plug 220, a bottom electrode pattern BEP, a magnetic tunnel junction pattern MTJP2, a top electrode pattern TEP, a second interlayer insulating layer 212, an upper contact plug 222, and an interconnection line 240. The substrate 200, the first interlayer insulating layer 210, the lower contact plug 220, the bottom electrode pattern BEP, the top electrode pattern TEP, the second interlayer insulating layer 212, the upper contact plug 222, and the interconnection line 240 may be substantially the same as the substrate 100, the first interlayer insulating layer 110, the lower contact plug 120, the bottom electrode pattern BEP, the top electrode pattern TEP, the second interlayer insulating layer 112, the upper contact plug 122, and the interconnection line 140, which are discussed with reference to FIGS. 5A and 5B.

The magnetic tunnel junction pattern MTJP2 may be disposed between the bottom electrode pattern BEP and the top electrode pattern TEP. The magnetic tunnel junction pattern MTJP2 may include a metal oxide pattern 230, a free pattern FP, a tunnel barrier pattern TBP, and a reference pattern RP. The free pattern FP and the reference pattern RP may be spaced apart from each other with the tunnel barrier pattern TBP interposed therebetween. The free pattern FP, the tunnel barrier pattern TBP, and the reference pattern RP may be sequentially stacked on the bottom electrode pattern BEP, unlike FIGS. 5A and 5B.

The metal oxide pattern 230 may be disposed between the free pattern FP and the bottom electrode pattern BEP. The metal oxide pattern 230 may include a metal oxide. For example, the metal oxide pattern 230 may include substantially the same material as the capping pattern 130 discussed with reference to FIGS. 5A and 5B. In some embodiments, the metal oxide pattern 230 may be omitted.

According to some embodiments, the free pattern FP may include a first sub-free pattern SFP1, a second sub-free pattern SFP2, and a third sub-free pattern SFP3, as illustrated in FIG. 7A. According to some embodiments, as illustrated in FIG. 7B, the third sub-free pattern SFP3 may be omitted and the free pattern FP may include the first sub-free pattern SFP1 and the second sub-free pattern SFP2. The first to third sub-free patterns SFP1, SFP2, and SFP3 may be substantially the same as the first to third sub-free patterns SFP1, SFP2, and SFP3 discussed with reference to FIGS. 5A and 5B, respectively.

In particular, the first sub-free pattern SFP1 may be disposed between the tunnel barrier pattern TBP and the third sub-free pattern SFP3, and the second sub-free pattern SFP2 may be disposed between the first sub-free pattern SFP1 and the third sub-free pattern SFP3. The first sub-free pattern SFP1 may have one surface being in contact with the tunnel barrier pattern TBP and another surface being in contact with the second sub-free pattern SFP2. The second sub-free pattern SFP2 may have one surface being in contact with the first sub-free pattern SFP1 and another surface being in contact with the third sub-free pattern SFP3.

A thickness of the first sub-free pattern SFP1 may be greater than those of the second and third sub-free patterns SFP2 and SFP3. In some embodiments, the thickness of the first sub-free pattern SFP1 may range from about 5 Å to about 15 Å, the thickness of the second sub-free pattern SFP2 may range from about 2 Å to about 10 Å, and the thickness of the third sub-free pattern SFP3 may range from about 2 Å to about 10 Å.

The first sub-free pattern SFP1 may include cobalt-iron-boron (CoFeB). The second sub-free pattern SFP2 may include nickel-cobalt-iron-boron (NiCoFeB). A nickel content of the second sub-free pattern SFP2 may range from about 10 atomic percent to about 40 atomic percent. The third sub-free pattern SFP3 may include nickel-iron-boron (NiFeB). A nickel content of the third sub-free pattern SFP3 may range from about 10 atomic percent to about 40 atomic percent.

A nickel content of the first sub-free pattern SFP1 may be smaller than the nickel content of the second sub-free pattern SFP2 and the nickel content of the third sub-free pattern SFP3. For example, the first sub-free pattern SFP1 may not include nickel or may include nickel diffused from the second sub-free pattern SFP2 and/or the third sub-free pattern SFP3.

A cobalt content of the third sub-free pattern SFP3 may be smaller than a cobalt content of the first sub-free pattern SFP1 and a cobalt content of the second sub-free pattern SFP2. For example, the third sub-free pattern SFP3 may not include cobalt or may include cobalt diffused from the first sub-free pattern SFP1 and/or the second sub-free pattern SFP2.

The tunnel barrier pattern TBP and the reference pattern RP may be sequentially stacked on the free pattern FP. The tunnel barrier pattern TBP and the reference pattern RP may be substantially the same as the tunnel barrier pattern TBP and the reference pattern RP discussed with reference to FIGS. 5A and 5B, respectively.

According to some embodiments of the inventive concept, the free pattern FP may include the first sub-free pattern SFP1 including cobalt-iron-boron (CoFeB) and the second sub-free pattern SFP2 including nickel-cobalt-iron-boron (NiCoFeB). The nickel content of the second sub-free pattern SFP2 may range from about 10 atomic percent to about 40 atomic percent. Furthermore, according to some embodiments of the inventive concept, the free pattern FP may further include the third sub-free pattern SFP3 including nickel-iron-boron (NiFeB). The nickel content of the third sub-free pattern SFP3 may range from about 10 atomic percent to about 40 atomic percent. Thus, a switching current of the magnetic tunnel junction pattern can be reduced in a state where thermal stability of the magnetic tunnel junction pattern is maintained. This will be discussed with reference to FIG. 9.

Figure 8A:
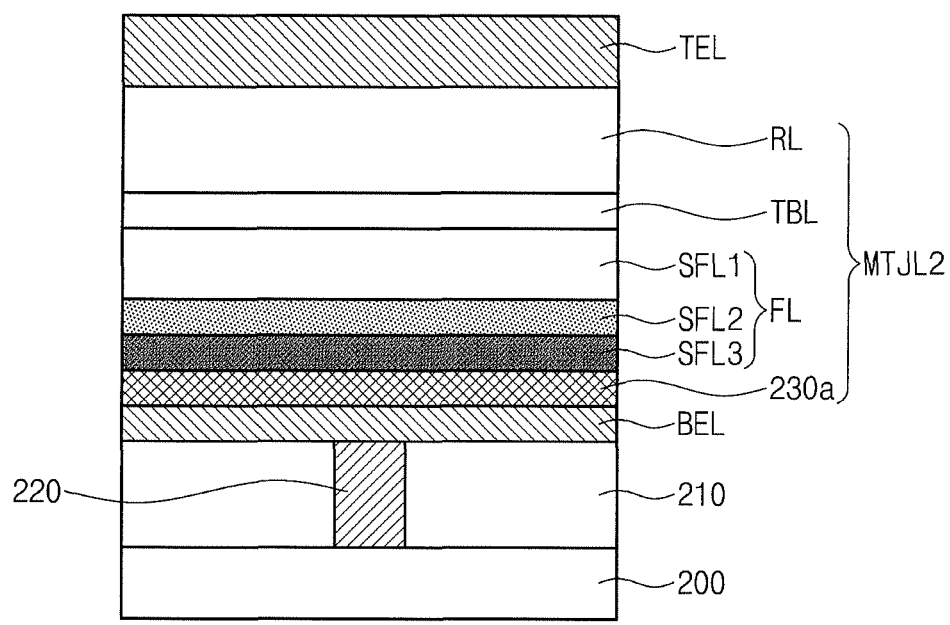
FIGS. 8A and 8B are cross-sections illustrating processing steps in the fabrication of a magnetic memory device according to some embodiments of the inventive concept.
Figure 8B:
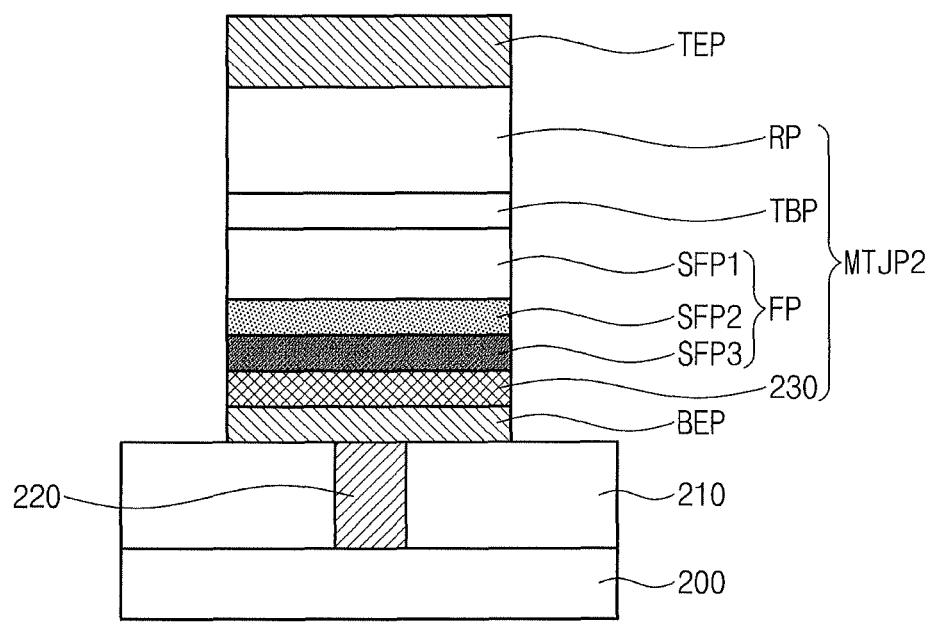

FIGS. 8A and 8B are cross-sections illustrating a method for manufacturing a magnetic memory device according to some embodiments of the inventive concept. Hereinafter, the same or similar components as in the embodiments of FIGS. 7A and 7B will be indicated by the same or similar reference numerals or the same or similar reference designators. The descriptions to these components will be omitted or mentioned briefly for the purpose of ease and convenience in explanation.

Referring to FIG. 8A, a first interlayer insulating layer 210 may be formed on a substrate 200. Next, a lower contact plug 220 may be formed to penetrate the first interlayer insulating layer 210, and a bottom electrode layer BEL may be formed on the first interlayer insulating layer 210. Processes of forming the first interlayer insulating layer 210, the lower contact plug 220, and the bottom electrode layer BEL may be substantially the same as the processes of forming the first interlayer insulating layer 110, the lower contact plug 120, and the bottom electrode layer BEL, which are discussed with reference to FIGS. 6A and 6B.

A metal oxide layer 230a may be formed on the bottom electrode layer BEL. The metal oxide layer 230a may include a metal oxide. The metal oxide layer 230a may be formed using a PVD process, a CVD process, or an ALD process. For example, the metal oxide layer 230a may be formed using a sputtering deposition process. In some embodiments, the process of forming the metal oxide layer 230a may be omitted.

A magnetic tunnel junction layer MTJL2 may be formed on the bottom electrode layer BEL. Forming the magnetic tunnel junction layer MTJL2 may include forming a reference layer RL, a free layer FL, and a tunnel barrier layer TBL between the reference and free layers RL and FL.

In particular, the free layer FL may be formed on the metal oxide layer 230a (or on the bottom electrode layer BEL). Forming the free layer FL may include forming a first sub-free layer SFL1, a second sub-free layer SFL2, and a third sub-free layer SFL3. The first sub-free layer SFL1 may be formed between the tunnel barrier layer TBL and the third sub-free layer SFL3, and the second sub-free layer SFL2 may be formed between the first sub-free layer SFL1 and the third sub-free layer SFL3. For example, the third sub-free layer SFL3 may be formed directly on the metal oxide layer 230a (or the bottom electrode layer BEL), the second sub-free layer SFL2 may be formed directly on the third sub-free layer SFL3, and the first sub-free layer SFL1 may be formed directly on the second sub-free layer SFL2. Immediately after the formation of each of the first to third sub-free layers SFL1 to SFL3, each of the first to third sub-free layers SFL1 to SFL3 may be in an amorphous state.

Except for the process order of the first to third sub-free layers SFL1 to SFL3, the process of forming each of the first to third sub-free layers SFL1 to SFL3 may be substantially the same as the process of forming each of the first to third sub-free layers SFL1 to SFL3, discussed with reference to FIGS. 6A and 6B.

In some embodiments, the process of forming the third sub-free layer SFL3 may be omitted, unlike FIG. 8A. These embodiments may correspond to a process for manufacturing the magnetic memory device illustrated in FIG. 7B.

The tunnel barrier layer TBL may be formed on the free layer FL. Next, the reference layer RL may be formed on the tunnel barrier layer TBL. Except for the process order of the tunnel barrier layer TBL and the reference layer RL, the process of forming each of the tunnel barrier layer TBL and the reference layer RL may be substantially the same as the process of forming each of the tunnel barrier layer TBL and the reference layer RL, discussed with reference to FIGS. 6A and 6B.

A thermal treatment process may be performed after the formation of the reference layer RL. By the thermal treatment process, boron (B) included in the free layer FL may be diffused into other layers adjacent thereto. For example, boron (B) included in the free layer FL may be diffused into the tunnel barrier layer TBL and/or the metal oxide layer 230a by the thermal treatment process. Thus, at least a portion of the free layer FL may be crystallized.

Iron atoms of the first sub-free layer SFL1 may be combined with oxygen atoms of the tunnel barrier layer TBL at an interface of the first sub-free layer SFL1 and the tunnel barrier layer TBL by the thermal treatment process, and thus interfacial perpendicular magnetic anisotropy may be induced at the interface. Likewise, iron atoms of the third sub-free layer SFL3 may be combined with oxygen atoms of the metal oxide layer 230a at an interface of the third sub-free layer SFL3 and the metal oxide layer 230a by the thermal treatment process, and thus interfacial perpendicular magnetic anisotropy may be induced at the interface.

A top electrode layer TEL may be formed on the magnetic tunnel junction layer MTJL2. The process of forming the top electrode layer TEL may be substantially the same as the process of forming the top electrode layer TEL, discussed with reference to FIGS. 6A and 6B.

Referring now to FIG. 8B, the top electrode layer TEL, the magnetic tunnel junction layer MTJL2, and the bottom electrode layer BEL may be sequentially patterned to form a bottom electrode pattern BEP, a magnetic tunnel junction pattern MTJP2, and a top electrode pattern TEP, which are sequentially stacked. Patterning the layers TEL, MTJL2, and BEL may be performed using, for example, an ion beam etching process. The magnetic tunnel junction pattern MTJP2 may include a metal oxide pattern 230, a free pattern FP, a tunnel barrier pattern TBP, and a reference pattern RP, which are formed by patterning the metal oxide layer 230a, the free layer FL, the tunnel barrier layer TBL, and the reference layer RL. The free pattern FP may include first to third sub-free patterns SFP1, SFP2, and SFP3 which are formed by patterning the first to third sub-free layers SFL1, SFL2, and SFL3.

Referring again to FIG. 7A, a second interlayer insulating layer 212 may be formed to cover the bottom electrode pattern BEP, the magnetic tunnel junction pattern MTJP2, and the top electrode pattern TEP. An upper contact plug 222 may be formed to penetrate the second interlayer insulating layer 212. The upper contact plug 222 may be electrically connected to the top electrode pattern TEP. An interconnection line 240 may be formed on the second interlayer insulating layer 212 so as to be electrically connected to the upper contact plug 222.

Figure 9:
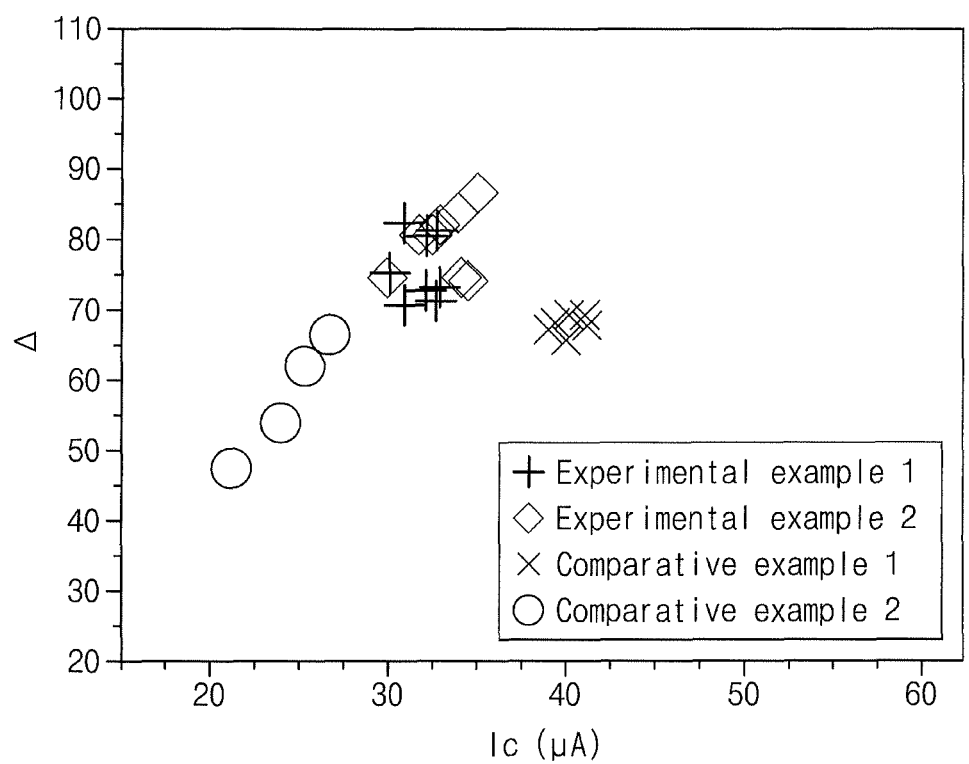
FIG. 9 is a graph showing thermal stabilities and switching currents of magnetic tunnel junction patterns according to some embodiments of the inventive concept and comparative examples.

Referring now to FIG. 9, a graph showing thermal stabilities and switching currents of magnetic tunnel junction patterns according to experimental examples of the inventive concept and comparative examples will be discussed. Hereinafter, features and effects of the inventive concept will be discussed in more detail through experimental examples of the inventive concept and comparative examples with reference to FIG. 9. These experimental examples are provided so that the inventive concept will be thorough and complete. However, it will be understood that the inventive concept are not limited to these experimental examples.

Referring to FIG. 9, magnetic tunnel junction patterns were formed according to the experimental examples and the comparative examples, and thermal stabilities Δ and switching currents Ic of the magnetic tunnel junction patterns were measured. The experimental examples and the comparative examples were manufactured by the following methods. In each of the experimental examples and the comparative examples, the magnetic tunnel junction pattern was formed to have a reference pattern, a tunnel barrier pattern, and a free pattern, which were sequentially stacked. In the experimental examples and the comparative examples, other components except the free patterns were formed by the same methods.

Experimental Example 1

In experimental example 1, the free pattern was formed to have substantially the same structure as the free pattern FP discussed with reference to FIG. 5A.

In particular, in experimental example 1, the free pattern was formed to have a first sub-free pattern, a second sub-free pattern, and a third sub-free pattern, which were sequentially stacked. The first sub-free pattern was forming to include cobalt-iron-boron (CoFeB), the second sub-free pattern was formed to include nickel-cobalt-iron-boron (NiCoFeB), and the third sub-free pattern was formed to include nickel-iron-boron (NiFeB). A nickel content of the second sub-free pattern was in a range of 10 atomic percent to 40 atomic percent, and a nickel content of the third sub-free pattern was in a range of 10 atomic percent to 40 atomic percent.

Experimental Example 2

In experimental example 2, the free pattern was formed to have substantially the same structure as the free pattern FP discussed with reference to FIG. 5B.

In particular, in experimental example 2, the free pattern was formed to have a first sub-free pattern and a second sub-free pattern, which were sequentially stacked. The first sub-free pattern was forming to include cobalt-iron-boron (CoFeB), and the second sub-free pattern was formed to include nickel-cobalt-iron-boron (NiCoFeB). A nickel content of the second sub-free pattern was in a range of 10 atomic percent to 40 atomic percent.

Comparative Example 1

In comparative example 1, the free pattern was formed of a general cobalt-iron-boron (CoFeB) single layer.

Comparative Example 2

In comparative example 2, the free pattern was formed to have a first sub-free pattern and a second sub-free pattern, which were sequentially stacked. The first sub-free pattern was formed to include cobalt-iron-boron (CoFeB), and the second sub-free pattern was formed to include nickel-cobalt-iron-boron (NiCoFeB). A nickel content of the second sub-free pattern was higher than 40 atomic percent.

Comparison of Experimental Examples 1 and 2 with Comparative Example 1

It can be recognized that switching currents of the free patterns according to the experimental examples 1 and 2 of the inventive concept are lower than that of the free pattern formed of the general cobalt-iron-boron (CoFeB) single layer. This may be because a saturation magnetization of the free pattern is reduced by adding nickel (Ni) of which a saturation magnetization is smaller than that of cobalt (Co) or iron (Fe).

Furthermore, it can be recognized that thermal stabilities of the free patterns according to the experimental examples of the inventive concept are similar to or higher than that of the free pattern formed of the general cobalt-iron-boron (CoFeB) single layer.

Comparison of Experimental Examples 1 and 2 with Comparative Example 2

The experimental examples 1 and 2 of the inventive concept are compared with the comparative example 2. As the nickel content of the second sub-free pattern exceeds 40 atomic percent, the switching current may be reduced and the thermal stability may also be reduced. This may be because the coercive force of the free pattern is reduced by excessively adding nickel (Ni).

As a result, according to some embodiments of the inventive concept, the nickel content of the second sub-free pattern and the nickel content of the third sub-free pattern may be adjusted in suitable ranges, and thus the switching current of the magnetic tunnel junction pattern may be reduced while maintaining the thermal stability of the magnetic tunnel junction pattern.

While the inventive concept have been described with reference to example embodiments, it will be apparent to those skilled in the art that various changes and modifications may be made without departing from the spirits and scopes of the inventive concept. Therefore, it should be understood that the above embodiments are not limiting, but illustrative. Thus, the scopes of the inventive concept are to be determined by the broadest permissible interpretation of the following claims and their equivalents, and shall not be restricted or limited by the foregoing description.

What is claimed is:

1. A magnetic memory device comprising:
   a magnetic tunnel junction pattern comprising a free pattern, a reference pattern and a tunnel barrier pattern between the free pattern and the reference pattern, the free pattern comprising:
   a first sub-free pattern;
   a second sub-free pattern; and
   a third sub-free pattern,
   wherein the first sub-free pattern is between the tunnel barrier pattern and the third sub-free pattern;
   wherein the second sub-free pattern is between the first sub-free pattern and the third sub-free pattern and includes nickel-cobalt-iron-boron (NiCoFeB);
   wherein the third sub-free pattern includes nickel-iron-boron (NiFeB);
   wherein a thickness of the first sub-free pattern is greater than a thickness of the second sub-free pattern and a thickness of the third sub-free pattern;
   wherein a nickel content of the first sub-free pattern is smaller than a nickel content of the second sub-free pattern and a nickel content of the third sub-free pattern; and
   wherein a cobalt content of the third sub-free pattern is smaller than a cobalt content of the second sub-free pattern.

2. The magnetic memory device of claim 1, wherein a nickel content of the second sub-free pattern ranges from 10 atomic percent to 40 atomic percent.

3. The magnetic memory device of claim 1, wherein a nickel content of the third sub-free pattern ranges from 10 atomic percent to 40 atomic percent.

4. The magnetic memory device of claim 1, wherein the first sub-free pattern includes cobalt-iron-boron (CoFeB).

5. The magnetic memory device of claim 1, wherein the second sub-free pattern has a first surface in contact with the first sub-free pattern and a second surface, different from the first surface, in contact with the third sub-free pattern.

6. The magnetic memory device of claim 5, wherein the first sub-free pattern is in contact with the tunnel barrier pattern.

7. The magnetic memory device of claim 1:
   wherein the thickness of the first sub-free pattern ranges from 5 Å to 15 Å;
   wherein the thickness of the second sub-free pattern ranges from 2 Å to 10 Å; and
   wherein the thickness of the third sub-free pattern ranges from 2 Å to 10 Å.

8. The magnetic memory device of claim 1, further comprising a capping pattern spaced apart from the tunnel barrier pattern with the free pattern therebetween, wherein the capping pattern includes a metal oxide.

9. The magnetic memory device of claim 8, wherein the capping pattern is in contact with the third sub-free pattern.

10. The magnetic memory device of claim 1:
    wherein the magnetic tunnel junction pattern is on a substrate; and
    wherein a magnetization direction of the free pattern and a magnetization direction of the reference pattern are substantially perpendicular to a top surface of the substrate.

11. A free layer of a magnetic tunnel junction pattern, the free layer comprising:
    a first sub-free pattern,
    a second sub-free pattern; and a third sub-free pattern,
wherein the first sub-free pattern is between a tunnel barrier pattern of the magnetic tunnel junction pattern and the third sub-free pattern;
wherein the second sub-free pattern is between the first sub-free pattern and the third sub-free pattern and includes nickel-cobalt-iron-boron (NiCoFeB);
wherein the third sub-free pattern includes nickel-iron-boron (NiFeB);
wherein a thickness of the first sub-free pattern is greater than a thickness of the second sub-free pattern and a thickness of the third sub-free pattern;
wherein a nickel content of the first sub-free pattern is smaller than a nickel content of the second sub-free pattern and a nickel content of the third sub-free pattern; and
wherein a cobalt content of the third sub-free pattern is smaller than a cobalt content of the second sub-free pattern.

12. The free layer of claim 11, wherein a magnetic tunnel junction pattern including the free layer provides a reduction in a switching current as compared to a conventional magnetic tunnel junction.

\* \* \* \* \*